United States Patent
Nagendra et al.

(10) Patent No.: US 6,358,583 B1
(45) Date of Patent: *Mar. 19, 2002

(54) LAMINATED COMPOSITE SHELL ASSEMBLY WITH JOINT BONDS

(75) Inventors: Somanath Nagendra; Evangelos Trifon Laskaris, both of Niskayuna, NY (US); Xianrui Huang, Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/196,424

(22) Filed: Nov. 19, 1998

(51) Int. Cl.$^7$ ................................. H01F 7/22
(52) U.S. Cl. .................. 428/36.3; 428/36.4; 428/36.91; 335/216
(58) Field of Search ................ 428/36.3, 36.4, 428/36.91; 335/216; 138/174

(56) References Cited

U.S. PATENT DOCUMENTS

| | | | |
|---|---|---|---|
| 3,963,882 A | * 6/1976 | Lewis | 179/115.5 |
| 4,287,495 A | * 9/1981 | Lund, Jr. et al. | 333/239 |
| 4,496,073 A | * 1/1985 | Silver et al. | 220/445 |
| 4,502,296 A | 3/1985 | Ogata et al. | 62/514 R |
| 4,800,354 A | * 1/1989 | Laskaris | 335/216 |
| 5,446,433 A | * 8/1995 | Laskaris et al. | 335/216 |
| 5,530,413 A | 6/1996 | Minas et al. | 335/216 |
| 5,554,430 A | * 9/1996 | Pollatta et al. | 428/113 |
| 5,563,566 A | 10/1996 | Laskaris et al. | 335/216 |
| 6,002,315 A | * 12/1999 | Heiberger et al. | 335/216 |

OTHER PUBLICATIONS

Gunther Hartwig, "Support Elements With Extremely Negative Thermal Expansion," Cryogenics, 1995, vol. 35, No. 11, pp. 717 & 718.

"Composite Sandwich Structure Optimization with Application to Satellite Components," Srinivas Kodiyalam, Somanath Nagendra and Joel DeStafano. AIAA Journal, vol. 34, No. 3, Mar. 1996, pp. 614–621.

"Optimal Stacking Sequence Design of Stiffened Composite Panels with Cutouts," Jul. 1994 Somanath Nagendra, Raphael T. Haftka and Zafer Gurdal. Virginia Polytechnic Institute and State University, Center for Composite Materials and Structures, CCMS–94–07, pp. ii,iii, 74–110.

* cited by examiner

Primary Examiner—Blane Copenheaver
Assistant Examiner—Alicia Chevalier
(74) Attorney, Agent, or Firm—Lester R. Hale; Donald S. Ingraham

(57) ABSTRACT

A laminated composite shell assembly includes composite shells assembled together and having joint bonds connecting the assembly with an external structure and pinch rings assembled to the shells adjacent the joint bonds so as to reinforce the same. The composite shells and pinch rings are cylindrical in configuration and made of layers of graphite-epoxy material having fibers oriented in desired stacking sequences. The shells and pinch rings are concentrically assembled in a desired sequence with some of the shells being adapted to perform a structural load bearing function while others of the shells are adapted to perform a load transfer function and with the pinch rings adapted to perform additional stiffening as well as load redistributing and transfer functions in the regions of the joint bonds between the assembled shells and the external structure.

22 Claims, 4 Drawing Sheets

| L1 | $[(45/-45)_2 / 90_2 / (45/-45)_2 / O_5 / (-45/45)_2 / 90_2 / (-45/45)_2]_t$ |
|---|---|
| L2 | $[(45/-45) / 90 / O_3 / 90 / (-45/45)]_t$ |
| L3 | $[(45/-45) / 90 / O_3 / 90 / (-45/45)]_t$ |
| L4 | $[(45/-45)]_t$ ADHESIVEBOND |
| L5 | $[(45/-45)_2 / 90_2 / (45/-45)_2 / O_5 / (-45/45)_2 / 90_2 / (-45/45)_2]_t$ |

C1' = L1' + L2' + L3'
C2' = L2' + L3'
C3' = L3'
C4' = OPR + L3'
C5' = OPR + L3' + L4' + L5'
C6' = L5' + L4' + L3' + IPR
C7' = L3' + IPR
C8' = L3'

Fig. 6

| | |
|---|---|
| L1' | [(45/-45)$_2$ / 90$_2$ / (45/-45)$_2$ /-10/10/-10/10/-10/-10/(-45/45)$_2$ / 90$_2$ / (-45/45)$_2$]$_t$ |
| L2' | [(45/-45)$_2$ / 90 /-10/10/-10/ 90 / (-45/45)]$_t$ |
| L3' | [(45/-45) / 90 /-10/10/-10/ 90 / (-45/45)]$_t$ |
| L4' | [(45/-45)]$_t$ ADHESIVEBOND |
| L5' | [(45/-45)$_2$ / 90$_2$ / (45/-45)$_2$ /-10/10/-10/10/-10/-10/(-45/45)$_2$ / 90$_2$ / (-45/45)$_2$]$_t$ |
| OPR | [45/-45/-30/30/30/-30/10]$_t$ |
| IPR | [45/-45/45/-30/-30/90]$_t$ |

LAMINATED COMPOSITE SHELL ASSEMBLY WITH JOINT BONDS

BACKGROUND OF THE INVENTION

The present invention generally relates to tube suspension systems for magnets and, more particularly, is concerned with a laminated composite shell assembly having joint bonds.

Superconductive magnets include superconductive coils which generate uniform and high strength magnetic fields, such as used, without limitation, in magnetic resonance imaging (MRI) systems employed in the field of medical diagnostics. The superconductive coils of the magnet typically are enclosed in a cryogenic vessel surrounded by a vacuum enclosure and insulated by a thermal shield interposed therebetween.

Various designs of tube suspensions are employed to support the cryogenic vessel of a superconductive coil assembly of the magnet from and in spaced apart relation to both the thermal shield and the vacuum enclosure of the magnet. As one example, the tube suspension can include overlapped fiberglass outer and inner support cylinders, such as disclosed in U.S. Pat. No. 5,530,413 to Minas et al. which is assigned to the same assignee as the present invention. In the Minas et al. tube suspension, the outer support cylinder is located within and generally spaced apart from the vacuum enclosure and positioned outside of and generally spaced apart from the thermal shield. A first end of the outer support cylinder is rigidly connected to the vacuum enclosure while a second end of the outer support cylinder is rigidly connected to the thermal shield. The inner support cylinder is located within and generally spaced apart from the thermal shield and is positioned outside of and generally spaced apart from the superconductive coil assembly. The inner support cylinder has a first end rigidly connected to the thermal shield near the second end of the outer support cylinder and has a second end located longitudinally between the first and second ends of the outer support cylinder and rigidly connected to the superconductive coil assembly.

Problems can occur, however, with some designs of tube suspension systems at cryogenic temperatures. For instance, tube suspensions of some current superconductive magnet designs in MRI systems employ metal alloys or glass-epoxy materials. Metal alloys as well as glass-epoxy materials do not provide optimal load distributing and thermal insulating characteristics. Further, metal alloys are heavy and glass-epoxy materials deform as they tend to be compliant. Also, adhesive bonded joints are oftentimes supported by bolts or rivets. Such joints tend to act as a local weak link in the assembled structure. In the presence of cryogenic environments and combined thermo-mechanical loads, adhesive bonds become stiffer and can result in regions of localized failure leading to a compromise in structural integrity.

Consequently, a need exists for innovation with respect to tube suspensions for supporting superconductive magnets which will provide a solution to the aforementioned problems.

BRIEF SUMMARY OF THE INVENTION

The laminated composite shell assembly of the present invention employs one or more laminated pinch rings reinforcing one or more joint bonds of the assembly. The laminated composite shell assembly per se has a sequence of laminated composite shells which comprises the invention of patent application Ser. No. 09/196,423 assigned to the assignee of the present invention. The laminated composite shells are made of composite layers having fibers (such as graphite-epoxy material) and assembled together to form the assembly. The graphite-epoxy material is stiffer than glass-epoxy material and tends to deform elastically rather than plastically. The use of bolts or rivets to support joint bonds connecting the assembled composite shells to external structures would cause the holes in the laminates to act as stress concentrators and weaken the assembly. The introduction of laminated pinch rings adjacent the locations of the joint bonds in place of bolts or rivets eliminates the need for holes in the laminates and so avoids the problem of stress concentration. The laminated pinch rings reinforce the joint bonds by providing additional stiffness and simultaneously acting as load redistribution members.

In an embodiment of the present invention, a laminated composite shell assembly is provided which can be used in a tube suspension for a magnet. The laminated composite shell assembly includes a plurality of laminated composite shells assembled to one another and having one or more joint bonds at which the composite shells are connected to an external structure. The assembly further includes one or more laminated pinch rings assembled to the composite shells adjacent to the joint bonds so as to reinforce the joint bonds.

The composite shells and pinch rings are substantially cylindrical in configuration and have a predetermined axial direction. Each shell and pinch ring is made of composite layers having fibers with the fibers being oriented in a plurality of stacking sequences with reference to the axial direction of the shell and pinch ring. An example of the fibers of the shells and pinch rings are graphite fibers of a graphite-epoxy material. The shells are concentrically assembled in a desired sequence with some of the shells being adapted to perform a structural load bearing function while others of the shells are adapted to perform a load transfer function. The laminated pinch rings are concentrically assembled to the shells so as to perform additional stiffening as well as load redistributing and transfer functions in the regions of the joint bonds between the assembled shells and the external structure.

BRIEF DESCRIPTION OF THE DRAWINGS

FIG. 2 is a chart of various laminates in the composite shells of the assembly of FIG. 1.

FIG. 3 is a chart of the laminate stacking sequence and orientation of fibers of the various laminates in each of the composite shells of the assembly of FIG. 1.

FIG. 5 is a chart of various laminates in the composite shells and pinch rings of the assembly of FIG. 4.

FIG. 6 is a chart of the laminate stacking sequence and orientation of fibers of the laminates in the composite shells and pinch rings of the assembly of FIG. 4.

DETAILED DESCRIPTION OF THE INVENTION

Figure 1:
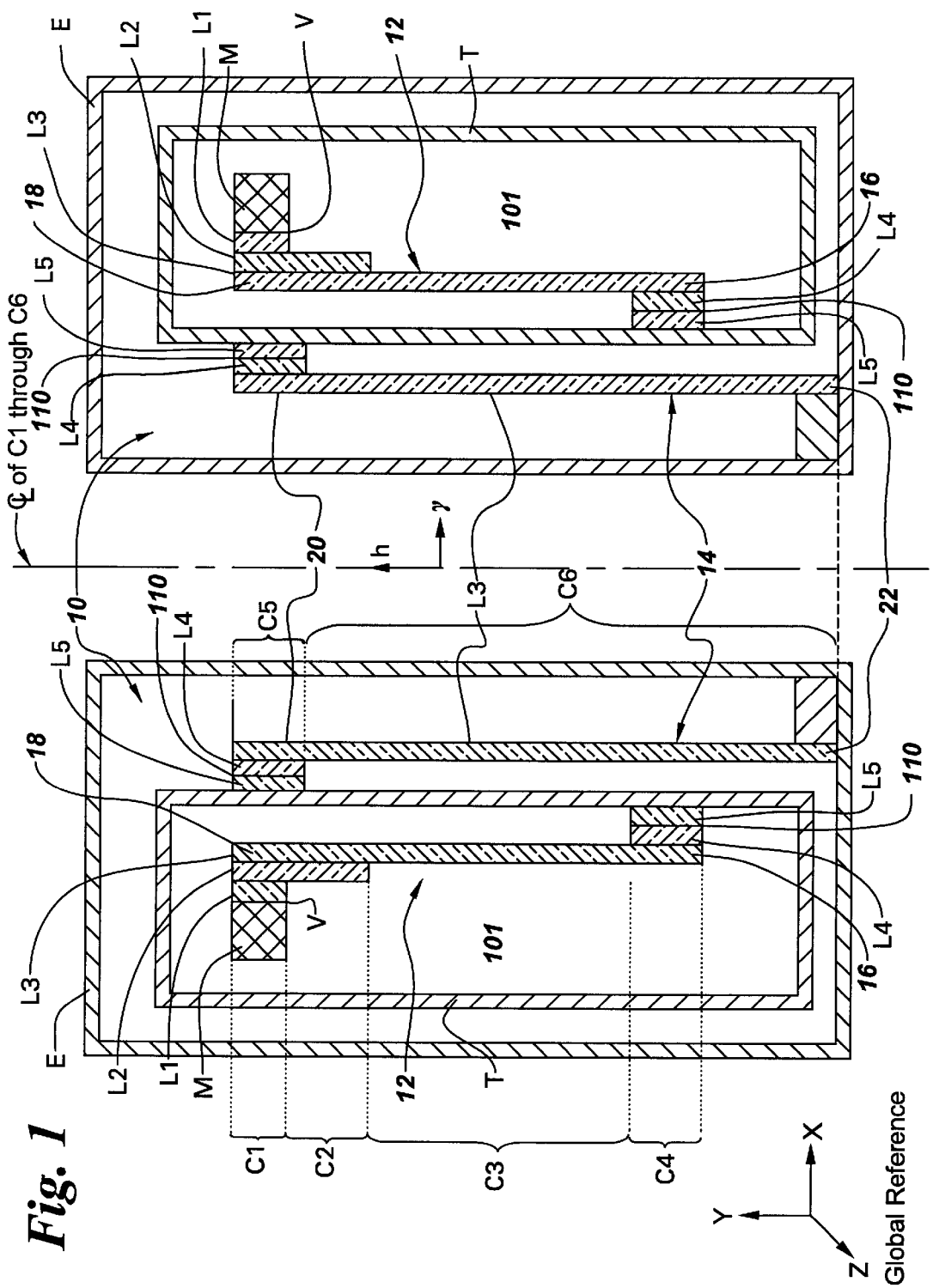
FIG. 1 is an exaggerated schematic cross-sectional view of the laminated composite shell assembly comprising the invention of above-cited patent application, the assembly being provided without any laminated pinch rings.
Figure 4:
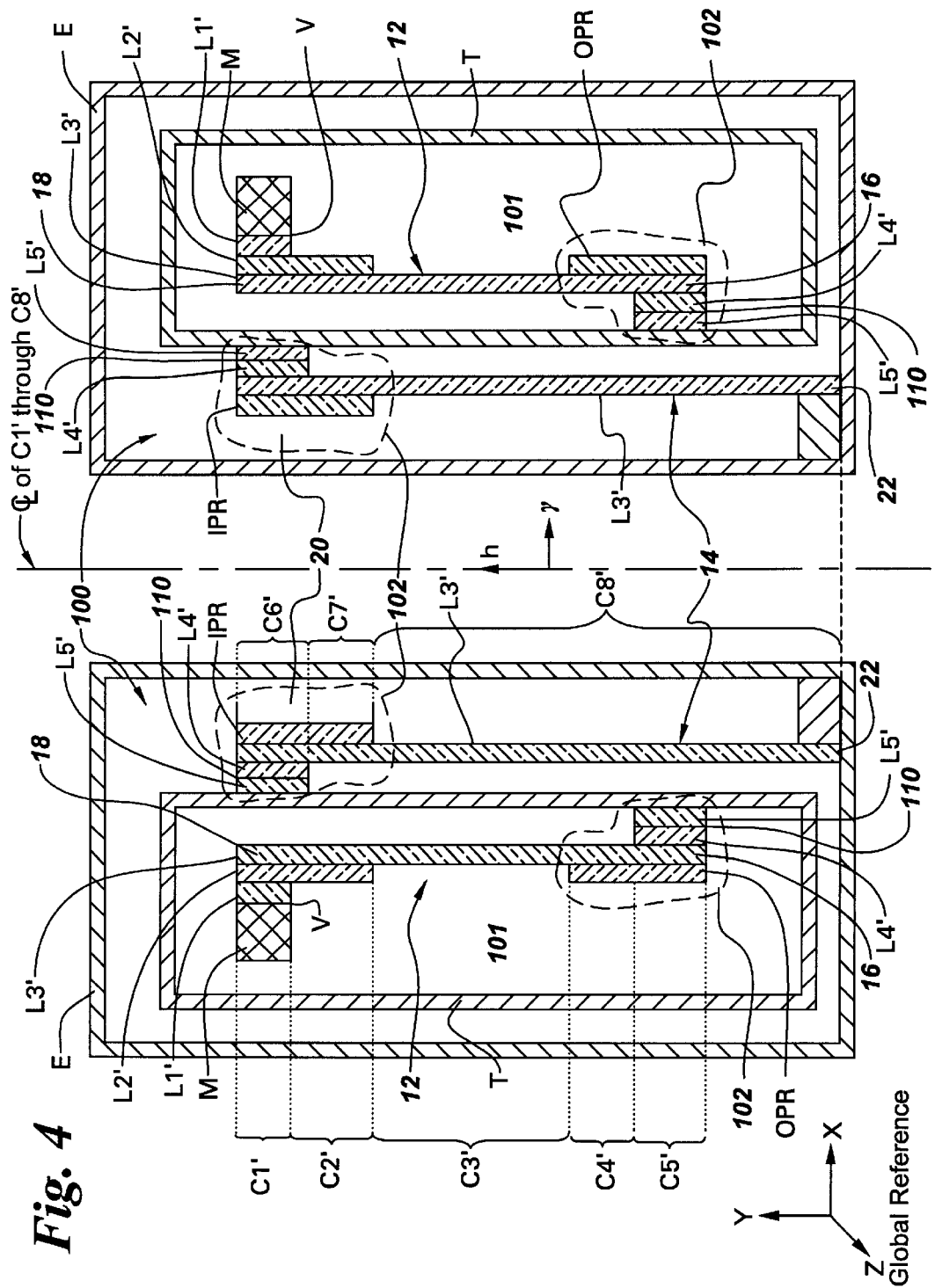
FIG. 4 is an exaggerated schematic cross-sectional view of the laminated composite shell assembly of the present invention having joint bonds reinforced by laminated pinch rings.

Referring now to the drawings and particularly to FIG. 1 and FIG. 4, there is illustrated in exaggerated form a laminated composite shell assembly, generally designated 10 and 100 in FIG. 1 and FIG. 4 respectively, provided as a tube suspension for a superconductive magnet such as used in MRI systems. As is well-known, a superconductive MRI magnet typically has a longitudinal central axis and includes a superconductive coil assembly M at cryogenic temperature, a thermal shield T enclosing the coil assembly and a vacuum enclosure E at ambient temperature enclosing the thermal shield. The coil assembly, thermal shield and vacuum enclosure are radially spaced from one another with reference to the longitudinal axis and are coaxially aligned with the longitudinal axis. The coil assembly includes a cryogenic vessel containing a cryogenic fluid 101 and superconductive coils. The vacuum enclosure, thermal shield and cryogenic vessel are in the form of tubular shells of annularly cylindrical configurations. An example of an open-type MRI magnet is found in U.S. Pat. No. 5,563,566 to Laskaris et al. whereas an example of a closed-type MRI magnet is found in aforecited U.S. Pat. No. 5,530,413. Both of these patents are assigned to the assignee of the present invention.

The tube suspension implemented by the composite shell assembly, and identified in FIG. 1 and FIG. 4 by reference numeral 10 and 100 respectively, is employed between the cryogenic vessel, thermal shield and vacuum enclosure, respectively, so as to allow both radial and axial movement of the cryogenic vessel and thus the coil assembly relative to the thermal shield and vacuum enclosure as the temperature of the cryogenic vessel changes between from ambient and cryogenic temperatures. As seen in exaggerated schematical form in FIG. 1 and FIG. 4, the composite shell assembly 10 and composite shell assembly 100, respectively can include a pair of inner and outer support cylinders 12, 14 axially overlapped with each other and substantially concentrically arranged with one another. The inner support cylinder 12 is located within and generally spaced apart from the thermal shield T and is positioned outside of and generally spaced apart from the cryogenic vessel, being represented by a dashed line V in FIG. 1 and FIG. 4. The inner support cylinder 12 has a first end 16 rigidly connected to one end of the thermal shield T and a second end 18 rigidly connected to the cryogenic vessel V. The outer support cylinder 14 is located within and generally spaced apart from the vacuum enclosure, being represented by a dashed line E in FIG. 1 and FIG. 4 and is positioned outside of and generally spaced apart from the thermal shield T. The outer support cylinder 14 has a first end 22 rigidly connected to the vacuum enclosure E and a second end 20 rigidly connected to an opposite end of the thermal shield T. As apparent in FIG. 1 and FIG. 4, the second end 20 of the outer support cylinder 14 is axially displaced from and generally overlapped with the first end 16 of the inner support cylindrical 12.

The construction of the composite shell assembly 10 of FIG. 1 per se constitutes the invention of copending patent application Ser. No. (General Electric Docket No. RD-26475) assigned to the assignee of the present invention. The composite shell assembly 10 of FIG. 1, which does not have reinforced joint bonds, is substantially equivalent to composite shell assembly 100 of FIG. 4 if its reinforced joint bonds are excluded. Therefore, the detailed description of the composite shell assembly 10 set forth in the copending patent application may be repeated and used herein to provide an enabling disclosure of the composite shell assembly 100.

The composite shell assembly 10 as shown in FIG. 1, provides a set of composite shells C, such as ones made up of graphite-epoxy material, such as T300/N5208, that can be assembled to form a desired sequence of composite shells C of various laminates L and thereby provide the inner and outer support cylinders 12, 14 of the composite shell assembly 10. In the illustrated embodiment of FIG. 1 and as per chart 22 of FIG. 2, there are composite shells C1 to C6 assembled in a desired sequence. Each shell C1 to C6 contains at least one of the laminates L1 to L5. Each of the laminates L1 to L5 and thus each of the composite shells C1 to C6 formed thereof is substantially a cylinder which includes a slightly tapering cylinder having a small angle of taper of about 1.6 degrees relative to its central axis. It can be noted in FIG. 1 that certain of adjacent ones of the laminates, such as L4 and L5 in the desired sequence of the shells are at least equal in axial length to one another. It can also be noted in FIG. 1 that certain of adjacent ones of the laminates, such as L3, L2 and L1, in the desired sequence of the shells are successively greater in axial length than the other.

Referring to FIG. 3, in a chart 24 there is illustrated the laminate stacking sequences that can be used in the construction of the various laminates L making up the various composite shells C of the assembly 10. The laminate stacking sequences identify the orientation of the fibers in different composite layers with respect to the axial direction of the shell C. When a composite layer is created by adjacent windings of a matrix-coated fiber, such as an epoxy-coated graphite-fiber thread (or tow), the laminate stacking sequences identify the winding orientation of the fibers. The off-axis orientations or +/−45°, +/−30° and +/−10° fibers are with reference to the axial direction of the composite shells C of the assembly 10. The 90° fibers are oriented along the hoop (or circumferential) direction (orthogonal to the axial direction) of the composite shells C whereas the 0° fibers are oriented along the axial direction of the composite shells C. The subscript "t" means the number of times the fiber layer stacking sequence is repeated.

The resultant laminates are designed to efficiently carry load and distribute the load both axially as well as circumferentially along the composite shells C. The fiber layer stacking sequences of the various laminates L comprising the composite shells C ensure that the ratio (A/R) of axial to radial (or hoop) stiffness both for extension as well as for flexure, as set forth in Table I, are close to unity, that is, approximately one. (The A/R values of the extension stiffness are on the left side of the slash mark and the A/R values of the radial stiffness are on the right side of the slash mark in the last column of Table I.)

TABLE I

| Composite Shell | Extension Stiffness | | Flexural Stiffness | | Ratio |
|---|---|---|---|---|---|
| | Axial | Radial | Axial | Radial | A/R |
| C1 | 25.26 | 21.51 | 9.20 | 8.56 | 1.17/1.07 |
| C2 | 11.62 | 9.11 | 0.71 | 0.62 | 1.27/1.14 |
| C3 | 5.81 | 4.55 | 0.06 | 0.08 | 1.27/0.75 |
| C4 | 19.69 | 17.19 | 4.97 | 5.00 | 1.14/0.99 |
| C5 | 13.64 | 12.39 | 1.19 | 1.87 | 1.10/0.64 |
| C6 | 19.69 | 17.19 | 4.97 | 5.00 | 1.14/0.99 |

Extension stiffness is terminology used to identify behavior of the shell which all takes place in-plane, that is, in the curvature of the shell. Flexural stiffness involves the bending behavior of the shell. The two behaviors, extensional and flexural, differ in that extensional behavior is "in-plane deformation" while flexural behavior is "out-of-plane" deformation. The "plane" referred to is the "plane of curvature" of the shell. Any behavior that acts along axes, such as a lengthwise axis and a directional through-the-thickness axis, coincident with the plane of curvature, that is, at any point on the curvature of the shell, involves the extensional behavior and relates to the extensional stiffness of the shell. By contrast any behavior that acts out of the plane of curvature of the shell, such as bending behavior, is flexural behavior and relates to the flexural stiffness of the shell. Each type of behavior (extensional and flexural) has an axial component which acts along the length of the shell and a hoop component which acts along the curvature of the shell. The goal is for the axial-to-radial ratio (A/R) for each type of behavior to equal one which means uniform stiffness behavior.

The ratio being close to unity or to one ensures that the effective laminate designs have uniform stiffness for all composite shells C. The effective response measure for stiffness is an estimate of the frequency of the assembled structure. The modal frequency of the first critical mode (without attached masses) is 207.73 Hz. The modal frequency of the first critcal mode (with attached masses) is 31.81 Hz.

It will be observed that the laminate L1 has a stacking sequence identical to that of laminate L5, and laminate L2 has a stacking sequence identical to that of laminate L3, but the identical laminates are found at different locations in the composite shells C made up of the laminate L1 to L5. Thus, even though the laminates L are identical with respect to their stacking sequences, they are identified as different laminates, have different L numbers, because their functionality is different. For example, with respect to composite shell C2, being made up of identical laminates L2 and L3, laminate L3 provides or forms a structural component performing a structural function while laminate L2 provides or forms a transitional component performing a load transition function into the structure laminate L3. So laminate L2 is there to provide compatability between shells C1 and C2. So the functional behavior of certain shells are different even though their laminates are identical. The same is true for laminates L1 and L5 although their state of stress and the joint functionality are different. With respect to laminate L1, it is behaving as an expansion component for the cryogenic vessel which is at around 4° K. With respect to laminate L5 (having the same stacking sequence as laminate L1), it is behaving as a continuity component at the one end of the thermal shield T which is at around 300° K. So in one location it (the same laminate with a particular stacking sequence) functions as a continuity component while in the other case it functions as an expansion component. The laminate L4 contains the non-reinforced adhesive bonds 110 between laminates L4 and L5 of shells C4 and C5 and the thermal shield T.

Composite shells C1 and C2 are joined only at certain locations, that being, at laminates L2 and L3 which are common between shells C1 and C2. Laminates L1 and L2 must satisfy certain conditions of continuity between shells C1 and C2. These conditions of continuity that must be satisfied are displacement compatibility, strain compatibility and load transfer between the two shells. The same holds true between shells C2 and C3, between shells C3 and C4, between shells C4 and C5, and shells C5 and C6. So the provision of a sequence of shells C having various combinations of laminates L is basically a means by which one can ensure these conditions of displacement, strain and load continuities are satisfied between any two adjacent shells.

Composite shell C1 is associated with a flange of the cryogenic vessel V. The behavior of shell C1 is very different from the behavior of shell C2. The behavior of shell C1 is to act to transfer the load from the cryogenic vessel V to the composite shell assembly 10. That particular flange, shell C1, has to move radially and axially. Allowance for the shell C1 to expand is also a function of shell C2 which has to accommodate that expansion. Shell C2 has to give the appropriate stiffness relaxation to allow the movement of shell C1. Shell C1 creates stress, which has to be transferred into shell C3 via shell C2. That is why the laminate L2 is provided to perform the function of transferring that stress into shell C3 from shell C1.

Referring to FIG. 4, there is illustrated the composite shell assembly 100 of the present invention having reinforced joint bonds 102 connecting the assembly 100 with the thermal shield T. The same reference numbers are used to identify the respective components of the assemblies 10 and 100 of FIGS. 1 and 4 that are substantially the same. Although the laminate stacking sequences of the laminates L1' to L5' of the composite shell assembly 100 differ somewhat from the laminate stacking sequences of laminates L1 to L5 of the composite shell assembly 10 described above, their functions in the various shells C, C' of the respective assemblies 10, 100 remain substantially the same and so there is no need to describe in detail the stacking sequences and orientations of the fibers of the shells C' of the composite shell assembly 100 of FIG. 4 as set forth in charts 104 and 106 in FIGS. 5 and 6, respectively. Only the reinforced joint bonds 102 of the laminated composite shell assembly 100 will be described hereinafter.

The laminated composite shell assembly 100 includes the plurality of laminated composite shells C' (C1' to C8' in FIG. 4) assembled to one another and having one or more of the reinforced joint bonds 102 (see FIG. 4) at which the composite shells C' are connected to an external structure, such as the thermal shield T. The composite shell assembly 100 further includes at least one and preferably both of inner and outer laminated pinch rings IPR and OPR (see FIG. 4) assembled to the composite shells C' adjacent the inner support cylinder first end 16 (IPR) and the outer support cylinder second end 20 (OPR), respectively so as to establish the reinforced joint bonds 102. The composite shells C' and inner and outer pinch rings IPR, OPR are substantially cylindrical in configuration and have an axial direction. Similar to each shell C', each pinch ring IPR, OPR is made of composite layers of fibers (such as graphite fibers of a graphite-epoxy material), with the fibers being oriented in the plurality of stacking sequences of FIG. 6 with reference to the axial direction of the shell C' and pinch ring IPR, OPR.

As explained earlier, the shells C' are concentrically assembled in a desired sequence wherein some of the shells C' are adapted to perform a structural load bearing function while others of the shells C' are adapted to perform a load transfer function. The laminated pinch rings IPR, OPR are concentrically assembled to the shells C' so that the pinch rings are adjacent and parallel to laminate L3' and to laminate L4' which includes the adhesive bonds 110 and perform additional stiffening as well as load redistributing and transfer functions in the regions of the reinforced joint bonds 102 between the assembled shells C' and the thermal shield T external to the shells C'.

Therefore, the reinforcing pinch rings IPR, OPR are designed for stiffening at the regions of the reinforced joint bonds 102 as ensuring alternate load transfer in such regions. The pinch rings IPR, OPR provide additional strength and stiffness to the structure of assembly 100 and simultaneously change the direction of the load from axial to a shear load. The adhesive bonds 110 are highly effective in shear and provide further efficient load transfer between laminates L' when the load is transferred as a shear load. The laminated inner pinch ring IPR and outer pinch ring OPR having the laminate stacking sequences of FIG. 6 provide efficient load redistribution. The outer pinch ring OPR can provide compressive force while the inner pinch ring IPR can provide tensile force by tailoring the laminate stacking sequence under combined loads. A 50% axial, a 29% hoop and a 35% shear stress reduction is achieved when the reinforcement combination, pinch rings IPR, OPR, is used instead of the laminate comprising the suspension tube or when there is no reinforcement applied. The effect of the reinforcement enables efficient load transfer as well as efficient stress redistribution. The reinforcement pinch rings also minimize bending moments at the edge of the reinforced joint bond 102 regions.

In Table II below, the properties of the inner and outer pinch rings IPR, OPR are set forth. Ex and Ey are Young's modulus values in x and y axes; Gxy is the shear modulus; $\alpha x$, $\alpha y$ and $\alpha xy$ are the thermal coefficients in x and y axes and shear thermal coefficient. The $\alpha x$ for inner pinch ring IPR has a positive (+) sign, while the $\alpha x$ for the outer pinch ring OPR has a negative (−) sign. Also, their magnitudes are completely different. The $\alpha y$ is very different for the inner and outer pinch rings in terms of magnitude. That means that substantial strain can be generated in either compression or tension at the respective locations. So pinch rings IPR and OPR have particular functions at a particular location. Thus, their stacking sequences are therefore different to serve their different functions.

TABLE II

|     | Ex kpsi | Ey kpsi | Gxy kpsi | Vxy | αx ppm/deg F. | αy ppm/deg F. | αxy ppm/deg F. |
|-----|---------|---------|----------|-----|---------------|---------------|----------------|
| IPR | 8.61    | 7.54    | 4.59     | 0.46| 2.29          | 3.34          | −0.001         |
| OPR | 11.63   | 4.55    | 4.40     | 0.70| −.09          | 8.45          | 0.014          |

In summary, the composite shell assembly 10 of FIG. 1 and also the composite shell assembly 100 of FIG. 4 can serve as the main suspension for the superconductive coil assembly M that mounts the cryogenic vessel V to the vacuum enclosure E. The thermal shield T insulates the colder inside environment of the cryogenic vessel V from the warmer outside environment of the vacuum enclosure E. The composite shell assemblies 10, 100 each can perform as both a thermal insulator and a load transfer mechanism acting to transfer the load from the cryogenic vessel V to the vacuum enclosure E. The composite shells C, C' of the assemblies 10, 100 include different laminates L, L' having different stacking sequences and employing graphite-epoxy material that provide enhanced thermal insulating and efficient load distributing properties for enabling use in cryogenic applications which involve extreme environments, such as one whose temperature ranges between 4° K. and 300° K. The laminated pinch rings IPR, OPR made of graphite-epoxy material the same as the shells C' and having different stacking sequences are provided to establish the reinforced joint bonds 102 between the shells C' and the thermal shield T.

It is thought that the present invention and its advantages will be understood from the foregoing description and it will be apparent that various changes may be made thereto without departing from the spirit and scope of the invention or sacrificing all of its material advantages, the above-described embodiment(s) being merely exemplary thereof.

What is claimed is:

1. A laminated composite shell assembly for use as a tube suspension in a superconductive magnet, said comprising:
   a plurality of laminated composite shells assembled to one another and having at least one reinforced joint bond at which at least one of said shells is connected with an external structure; and
   at least one laminated pinch ring assembled to at least one of said composite shells adjacent to at least an end of a support cylinder so as to establish said reinforced joint bond;
   said composite shells and pinch ring being substantially cylindrical in configuration and having an axial direction;
   each of said composite shells and said pinch ring being made of fibers wound into layers of laminates with said fibers being oriented in a plurality of stacking sequences with reference to said axial direction of said shells and pinch ring;
   said composite shells and at least one said pinch ring being concentrically assembled in an axially adjoining sequence of laminates and at least one said pinch ring axially overlapping each other only in part, wherein some of said shells perform a structural load bearing function while others of said shells perform a load transfer function and with at least one of said pinch rings performs additional stiffening as well as load redistributing and transfer functions as an integral part of said reinforced joint bond between said assembled shells and external structure; wherein each of said reinforced joint bonds provides required said structural load bearing and said load transfer functions at respective areas of reinforced joint bond locations without additional mechanical means disposed adjacent said reinforced joint bond locations.

2. The assembly of claim 1 in which said fibers of said composite shells and pinch ring are made of graphite fibers in an epoxy matrix.

3. The assembly of claim 1 in which at least some of said stacking sequences have said fibers in a layer oriented at about +45° with reference to said axial direction of said composite shells and pinch ring.

4. The assembly of claim 1 in which at least some of said stacking sequences have said fibers in a layer oriented at about −45° with reference to said axial direction of said composite shells and pinch ring.

5. The assembly of claim 1 in which at least some of said stacking sequences have said fibers in a layer oriented at about 90° with reference to said axial direction of said composite shells and pinch ring.

6. The assembly of claim 1 in which at least some of said stacking sequences have said fibers in a layer oriented at about +30° with reference to said axial direction of said composite shells and pinch ring.

7. The assembly of claim 1 in which at least some of said stacking sequences have said fibers in a layer oriented at about −30° with reference to said axial direction of said composite shells and pinch ring.

8. The assembly of claim 1 in which at least some of said stacking sequences have said fibers in a layer oriented at about +10° with reference to said axial direction of said composite shells and pinch ring.

9. The assembly of claim 1 in which at least some of said stacking sequences have said fibers in a layer oriented at about −10° with reference to said axial direction of said composite shells and pinch ring.

10. The assembly of claim 1 wherein an outer pinch ring lamination stacking sequence provides a compressive force as part of said reinforced joint bond where an inner support cylinder joins a thermal shield to perform said load redistributing and transfer functions.

11. The assembly of claim 1 wherein an inner pinch ring lamination stacking sequence provides a tensile force as part of said reinforced joint bond where an outer support cylinder joins a thermal shield to perform said load redistributing and transfer functions.

12. A laminated composite shell assembly for use as a tube suspension in a superconductive magnet, said assembly comprising:

a plurality of laminated composite shells assembled to one another and having a plurality of reinforced joint bonds at which said composite shells are connected with an external structure;

a plurality of laminated pinch rings assembled to selected ones of said composite shells adjacent to said ends of a plurality of said support cylinders so as to establish said reinforced joint bonds;

said composite shells and pinch rings being substantially cylindrical in configuration and having an axial direction;

each of said composite shells and said pinch rings being made of fibers wound into layers of laminates with said fibers being oriented in a plurality of stacking sequences with reference to said axial direction of said shells and pinch rings; and said composite shells and pinch rings being concentrically assembled in a desired sequence with respect to one another, some of said shells being adapted to perform a structural load bearing function while others of said shells are adapted to perform a load transfer function, some of said pinch rings being adapted for compression while others of said pinch rings are adapted for tension so as to perform load redistributing and transfer functions as an integral part of the said reinforced joint bonds between said assembled shells and external structure;

said composite shells and pinch rings being concentrically assembled in an axially adjoining sequence of laminates and said pinch rings axially overlapping each other only in part, wherein some of said shells perform a structural load bearing function while others of said shells perform a load transfer function, some of said pinch rings being disposed in compression while others of said pinch rings being disposed in tension; wherein said pinch rings perform load redistributing and transfer functions as an integral part of said reinforced joint bonds between said assembled shells and external structure; wherein said plurality of reinforced joint bonds provide required said structural load bearing and said load transfer functions at respective areas of reinforced joint bond locations without additional mechanical means disposed adjacent said reinforced joint bond locations.

13. The assembly of claim 12 in which said fibers of said composite shells and pinch ring are made of graphite fibers in an epoxy matrix.

14. The assembly of claim 12 in which at least some of said stacking sequences have said fibers in a layer wound at about +45° with reference to said axial direction of said composite shells and pinch rings.

15. The assembly of claim 12 in which at least some of said stacking sequences have said fibers in a layer wound at about −45° with reference to said axial direction of said composite shells and pinch rings.

16. The assembly of claim 12 in which at least some of said stacking sequences have said fibers in a layer wound at about 90° with reference to said axial direction of said composite shells and pinch rings.

17. The assembly of claim 12 in which at least some of said stacking sequences have said fibers in a layer wound at about +30° with reference to said axial direction of said composite shells and pinch rings.

18. The assembly of claim 12 in which at least some of said stacking sequences have said fibers in a layer wound at about −30° with reference to said axial direction of said composite shells and pinch rings.

19. The assembly of claim 12 in which at least some of said stacking sequences have said fibers in a layer wound at about +10° with reference to said axial direction of said composite shells and pinch rings.

20. The assembly of claim 12 in which at least some of said stacking sequences have said fibers in a layer wound at about −10° with reference to said axial direction of said composite shells and pinch rings.

21. The assembly of claim 12 wherein an outer pinch ring lamination stacking sequence provides a compressive force as part of said reinforced joint bond where an inner support cylinder joins a thermal shield to perform said load redistributing and transfer functions.

22. The assembly of claim 12 wherein an inner pinch ring lamination stacking sequence provides a tensile force as part of said reinforced joint bond where an outer support cylinder joins a thermal shield to perform said load redistributing and transfer functions.

* * * * *